United States Patent
Shin et al.

(10) Patent No.: US 9,577,109 B2
(45) Date of Patent: Feb. 21, 2017

(54) TRANSPARENT CONDUCTING FILM AND PREPARATION METHOD THEREOF

(71) Applicant: LG CHEM, LTD., Seoul (KR)

(72) Inventors: Dongmyung Shin, Daejeon (KR); Dong-Ryul Kim, Daejeon (KR); Chanyeup Chung, Daejeon (KR)

(73) Assignee: LG CHEM, LTD., Seoul (KR)

( * ) Notice: Subject to any disclaimer, the term of this patent is extended or adjusted under 35 U.S.C. 154(b) by 118 days.

(21) Appl. No.: 14/419,847

(22) PCT Filed: Sep. 17, 2013

(86) PCT No.: PCT/KR2013/008444
§ 371 (c)(1),
(2) Date: Feb. 5, 2015

(87) PCT Pub. No.: WO2014/046480
PCT Pub. Date: Mar. 27, 2014

(65) Prior Publication Data
US 2015/0194531 A1    Jul. 9, 2015

(30) Foreign Application Priority Data
Sep. 18, 2012 (KR) .......... 10-2012-0103498

(51) Int. Cl.
*H01L 29/10* (2006.01)
*H01L 29/12* (2006.01)
(Continued)

(52) U.S. Cl.
CPC ......... *H01L 29/7869* (2013.01); *C01G 15/006* (2013.01); *H01B 1/08* (2013.01);
(Continued)

(58) Field of Classification Search
USPC .............. 257/43, 519.1, E21.476, E29.068,257/E29.273; 423/594.14, 600; 438/104; 252/519.1
See application file for complete search history.

(56) References Cited

U.S. PATENT DOCUMENTS 6,878,962 B1    4/2005 Kawasaki et al.
2005/0039670 A1    2/2005 Hosono et al.
(Continued)

FOREIGN PATENT DOCUMENTS

JP    2002025349 A    1/2002
JP    2007-073312    * 3/2007    ............ H01B 13/00
(Continued)

OTHER PUBLICATIONS

Kenji Nomura, Hiromichi Ohta, Kazushige Ueda, Toshio Kamiya, Masahiro Hirano, Hideo Hosono, Thin-Film Transistor Fabricated in Single-Crystalline Transparent Oxide Semiconductor, Science vol. 300 May 23, 2003, 1269-1272.*
(Continued)

*Primary Examiner* — Bijan Ahvazi
(74) *Attorney, Agent, or Firm* — Dentons US LLP

(57) ABSTRACT

There are provided a transparent conductive film and a method for preparing the same. The transparent conductive film of the present application comprises a compound having a crystalline structure and represented by Chemical Formula 1 and thus can be applied as a technology substituting for conventional ITO conductive films.

17 Claims, 12 Drawing Sheets

(51) Int. Cl.

| | | |
|---|---|---|
| H01L 29/786 | (2006.01) | |
| H01B 1/08 | (2006.01) | |
| H01L 31/0224 | (2006.01) | |
| C01G 15/00 | (2006.01) | |
| H01L 29/45 | (2006.01) | |
| H01L 29/49 | (2006.01) | |
| H01L 29/51 | (2006.01) | |
| H01L 51/44 | (2006.01) | |
| H01B 1/02 | (2006.01) | |
| C01G 11/02 | (2006.01) | |
| C01G 13/02 | (2006.01) | |
| C01G 9/02 | (2006.01) | |
| C01F 7/00 | (2006.01) | |
| H01L 51/52 | (2006.01) | |

(52) U.S. Cl.
CPC .......... *H01L 29/45* (2013.01); *H01L 29/4908* (2013.01); *H01L 29/4966* (2013.01); *H01L 29/517* (2013.01); *H01L 29/78696* (2013.01); *H01L 31/022466* (2013.01); *H01L 51/442* (2013.01); *C01P 2002/76* (2013.01); *C01P 2002/77* (2013.01); *C01P 2006/40* (2013.01); *H01L 51/5206* (2013.01); *Y02E 10/549* (2013.01)

(56) References Cited

U.S. PATENT DOCUMENTS

| | | |
|---|---|---|
| 2006/0108636 A1 | 5/2006 | Sano et al. |
| 2007/0194379 A1 | 8/2007 | Hosono et al. |
| 2009/0278122 A1 | 11/2009 | Hosono et al. |
| 2011/0001136 A1 | 1/2011 | Hasegawa et al. |
| 2011/0003429 A1 | 1/2011 | Oikawa et al. |
| 2011/0177696 A1 | 7/2011 | Yano et al. |
| 2011/0240998 A1 | 10/2011 | Morosawa et al. |

FOREIGN PATENT DOCUMENTS

| | | | |
|---|---|---|---|
| JP | 2007-073312 A | 3/2007 | |
| JP | 2009-123957 A | 6/2009 | |
| JP | 2010-225384 | * 10/2010 | ............... H01B 5/14 |
| JP | 2010-225384 A | 10/2010 | |
| JP | 4568828 B2 | 10/2010 | |
| JP | 2011-29637 A | 2/2011 | |
| JP | 2011-228622 A | 11/2011 | |
| JP | 2011256108 A | 12/2011 | |
| KR | 10-2009-0087130 A | 8/2009 | |
| KR | 10-2011-0010799 A | 2/2011 | |
| KR | 2011-0022813 A | 3/2011 | |
| KR | 20110022813 | * 3/2011 | ............... C01G 9/02 |

OTHER PUBLICATIONS

Ping, L., et al., "Comparisons of ZnO codoped by group IIIA elements (Al, Ga, In) and N: a first-principle study," Chinese Physics B., vol. 19, No. 11, 2010, 117102, pp. 117102-1-117102-8.

Kimizuka, N., et al., "Syntheses and Crystallographic Data of the Homologous compounds inFeO3(ZnO)m (m=1, 2, 3, 7, 11, 13, 15, and 19) and Fe2O3(ZnO)m (m−8 and 9) in the In2O3—ZnFe2O4—ZnO System," Journal of Solid State Chemistry, vol. 103, 1993, pp. 394-402.

Yang, S., et al., "Improvement in the photon-induced bias stability of Al—Sn—Zn—In—O thin film transistors by adopting AlOx passivation layer," Applied Physics Letters, vol. 96, No. 21, May 2010, 213511, pp. 213511-1-213511-3.

* cited by examiner

Structure of Polytypoid-type transparent flexible backplane
(npn-type Transistor)

TRANSPARENT CONDUCTING FILM AND PREPARATION METHOD THEREOF

This application is a 35 USC §371 National Stage entry of International Application No. PCT/KR2013/008444, filed on Sep. 17, 2013, and claims priority to Korean Application No. 10-2012-0103498, filed on Sep. 18, 2012, both of which are hereby incorporated by reference in their entireties as if fully set forth herein.

TECHNICAL FIELD

The present invention relates to a transparent conductive film and a method for preparing the same.

BACKGROUND ART

A transparent conductive film refers to a thin film having high light transmittance and an electrically conductive property and has been widely used as a voltage apply type common electrode or pixel electrode of a liquid crystal display, an electrochromic display (ECD, an organic electroluminescence device, a solar cell, a plasma display panel, a flexible display, electronic paper, a touch panel, and the like.

As for transparent conducting oxides (TCOs), it is important to design a material which transmits light in the visible ray area and has high conductivity. In order to be transparent in the visible ray area (wavelength of 400 to 700 nm), an electronic energy band gap needs to be 3.1 eV or more equivalent to electromagnetic wave energy having a wavelength of 400 nm.

As representative oxide semiconductors satisfying such properties, there are ZnO (3.3 eV), $In_2O_3$ (3.7 eV), and $SnO_2$ (3.6 eV). Typically, the TCO has light transmittance of 80% or more in the visible ray area and specific resistance of about $10^{-4}$ Ωcm or less as an electrical property.

In order to find a material used for such TCOs, there has been mainly conducted research in which various materials are doped or alloyed. In particular, $In_2O_3$ has the specific resistance lower than that of $SnO_2$ or ZnO, and, thus, it was the first to be commercialized. ITO (Sn doped $In_2O_3$) has been used so far.

The ITO is a material having been used for an electrode for display in an LED, an LCD, a PDP, etc., a solar cell, and the like and has the low specific resistance of $10^{-4}$ Ωcm in general or $10^{-5}$ Ωcm in lab-scale which is close to specific resistance of metal.

However, the ITO has the disadvantage of high price since In is one of rare elements, and if it is exposed to hydrogen plasma often used in a flat panel display manufacturing process, In or Sn is reduced and electrical and optical properties may be deteriorated. Further, it is known that the ITO is an n-type semiconductor and cannot be converted into a p-type semiconductor. For this reason, it is impossible to constitute a homo junction circuit element with the ITO only.

DETAILED DESCRIPTION OF THE INVENTION

Technical Problem

In the pertinent technical field, there is in need of research on a transparent conductive film which has excellent properties and can be easily prepared and a method for preparing the same.

Technical Solution

According to one aspect of the present application, there is provided a transparent conductive film comprising a compound having a crystalline structure and represented by Chemical Formula 1 below.

$$[(R_pX_q)O_3]_m(AO)_n \qquad \text{[Chemical Formula 1]}$$

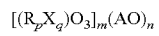

In Chemical Formula 1, R is Sc, Fe, Cu, Ga, Y, In, Er, Tm, Yb, or Lu, X is In, Ga, Al, or Fe, A is Mg, Mn, Co, or Zn, m is 1 to 4, n is 1 to 7, and p and q represent an atom content ratio of greater than 0 to 1 or less independently of each other.

Further, according to another aspect of the present application, there is provided a method for preparing the transparent conductive film comprising forming, on a substrate, a compound having a crystalline structure and represented by Chemical Formula 1.

Furthermore, according to still another aspect of the present application, there is provided an electronic element comprising the transparent conductive film.

Furthermore, according to still another aspect of the present application, there is provided a thin film transistor comprising the transparent conductive film.

Advantageous Effects

A transparent conductive film according to an exemplary embodiment of the present application comprises a compound having a crystalline structure and represented by Chemical Formula 1 and thus has excellent conductivity and transmittance. Further, the transparent conductive film according to an exemplary embodiment of the present application has excellent elasticity and adhesive strength. Furthermore, the transparent conductive film according to an exemplary embodiment of the present application has a low haze value. Therefore, the transparent conductive film according to the present application can be applied as a technology substituting for conventional ITO conductive films.

BEST MODE

Figure 1:
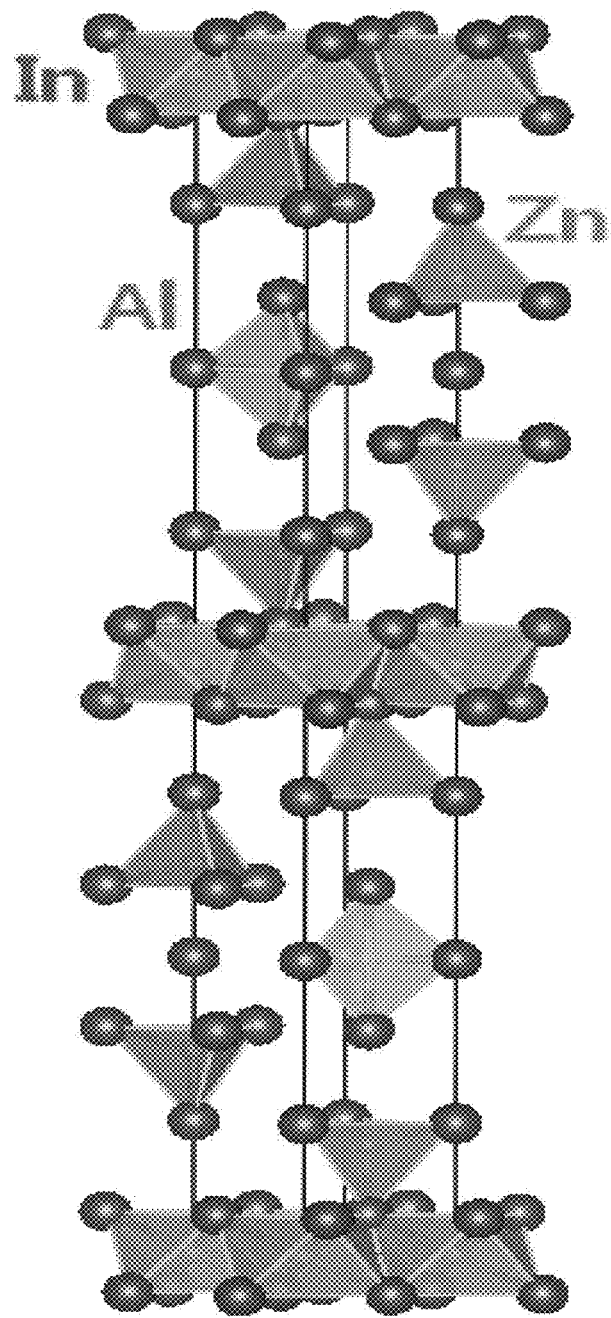
FIG. 1 illustrates a structure of $InAlO_3(ZnO)_4$ according to an exemplary embodiment of the present application.

Hereinafter, the present application will be explained in detail.

The present application can be applied to next-generation flexible devices, transparent AMOLED, OLED lighting, and solar cells as well as the industry of flat panel display devices such as LCD, PDP, and the like.

A transparent oxide semiconductor is very important as a key technology of the transparent electronics technology because the use of materials such as ITO (Sn-doped In$_2$O$_3$) and ZnO used as transparent electrodes of conventional optoelectronic devices is really considerable. In the case of the ITO as an n-type transparent electrode, its market is expected to grow to USD 6.9 billion (about 8.4 trillion won) by 2016.

It is well known that ITO or AZO (Al-doped ZnO) as the prototype of conventional n-type TCOs has been intensively researched and developed experimentally and theoretically. This is because such materials have high electrical conductivity and high transmission of photon and also have a metal s-orbital that exhibits spatial delocalization of a conduction band, and low energy, low effective mass, as an electronic structural property in common to n-type TCO materials. For example, cations such as Zn(II), Ga(III), and In(III) in a closed-shell ns$^0$ state are bonded to oxides.

Further, Ga-doped ZnO or F-doped SnO$_2$ has been known as a TCO material. It is known that these materials have a carrier concentration (N(cm$^{-3}$)) of 10$^{16}$ to 10$^{21}$ and an electron mobility ($\mu$(cm$^2$ V$^{-1}$ s$^{-1}$)) of about 10 to about 1,000.

In contradistinction to the delocalized conduction band, valence band state exhibits a localized O 2p state. Such a deep localized state involves local lattaic distortion, resulting in formation of a small polaron (a quasiparticle derived from an electric charge or an electric field).

Further, a hole conducting p-type TCO material has a structure which can transmit a hole since a metal such as Cu(I) has a low bond energy at a valence band maximum (VBM). However, its hole mobility is as low as less than 10 cm$^2$ V$^{-1}$ s$^{-1}$ due to an effect of a d band of localized metal such as Cu and existence of an indirect band gap.

In order to produce a new material compatible with various optoelectronic applications and requiring cheap raw material cost as compared with conventional TCOs, there has been conducted research on TCOs having various structures. As a new TCO material candidate, a ternary compound and binary compound such as ZnO—In$_2$O$_3$—SnO$_2$ system, ZnO—In$_2$O$_3$(IZO), and the like have been researched. However, we need to take note of TCO materials having more physicochemically stable and electrically and optically excellent properties. For example, there may be a homologous compound of which an ectronic structure can be calculated by density functional theory (DFT), super lattice which can demonstrate an electromagnetical applicability, and a material having a minimum interfacial strain and complying with the octet rule.

It is not too much to say that the final technical objective of such materials used in the transparent electronics is how to manufacture a transparent homo junction. Since all of the conventional transparent electrodes or devices use hetero junction, an electro rectifying voltage is low and an electrical mobility of the hetero junction is inferior to that of the homo junction. Therefore, the ultimate method to solve such a problem is to find a semiconductor material which can be bipolar doped.

Accordingly, a transparent conductive film according to an exemplary embodiment of the present application comprises a compound having a crystalline structure and represented by Chemical Formula 1 below.

$$[(R_pX_q)O_3]_m(AO)_n \qquad \text{[Chemical Formula 1]}$$

In Chemical Formula 1, R is Sc, Fe, Cu, Ga, Y, In, Er, Tm, Yb, or Lu, X is In, Ga, Al, or Fe, A is Mg, Mn, Co, or Zn, m is 1 to 4, n is 1 to 7, and p and q represent an atom content ratio of greater than 0 to 1 or less independently of each other.

In Chemical Formula 1, desirably, the R and the X may contain materials different from each other.

In the present application, the compound represented by Chemical Formula 1 may have a polytypoid structure.

In the present application, desirably, the R of Chemical Formula 1 may be In or Lu but may not be limited thereto.

In the present application, desirably, the X of Chemical Formula 1 may be Al, Ga, or Fe but may not be limited thereto.

In the present application, desirably, the A of Chemical Formula 1 may be Zn but may not be limited thereto.

In the present application, desirably, the compound represented by Chemical Formula 1 may be InAlO$_3$(ZnO)$_n$, InGaO$_3$(ZnO)$_n$, or LuFeO$_3$(ZnO)$_n$, and the n may be 1 to 7 but may not be limited thereto.

In Chemical Formula 1, if the n is an odd number, the compound may have a rhomohedral (R3m) structure, and if the n is an even number, the compound may have a hexagonal polymorph (P6$_3$/mmc) structure.

In particular, the compound represented by Chemical Formula 1 has a crystalline structure. As described above, since the compound represented by Chemical Formula 1 has a crystalline structure, it can satisfy transparency, conductivity, etc. as required in the art. Further, by additionally doping the compound represented by Chemical Formula 1 with an n-type dopant, a p-type dopant, etc., if necessary, transparency and electrical properties of the compound represented by Chemical Formula 1 can be regulated.

Figure 2:
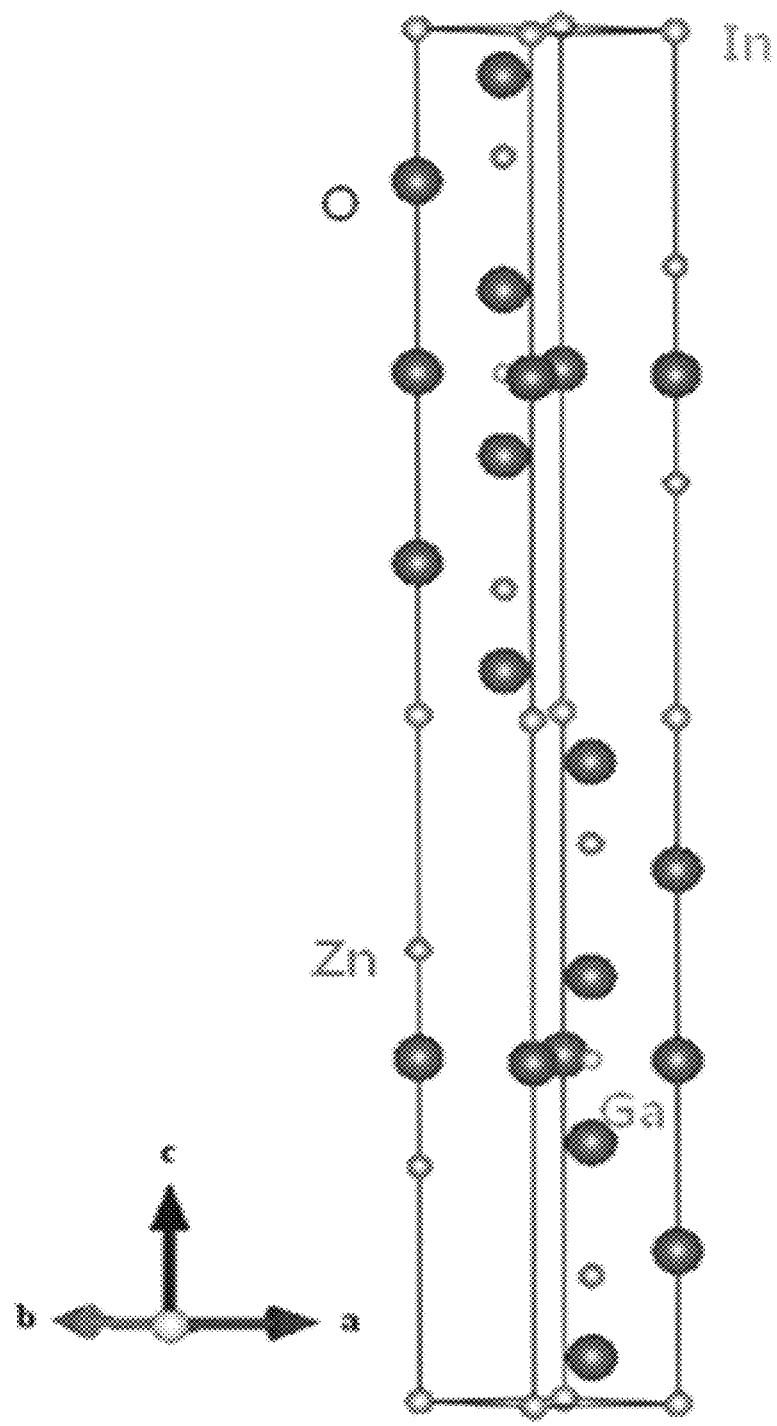
FIG. 2 illustrates a structure of $InGaO_3(ZnO)_4$ according to an exemplary embodiment of the present application.

To be more specific, as an exemplary embodiment of the present application, a structure of InAlO$_3$(ZnO)$_4$ is illustrated in FIG. 1, and a structure of InGaO$_3$(ZnO)$_4$ is illustrated in FIG. 2.

As an exemplary embodiment of the present application, the optimized lattice constants of InGaO$_3$(ZnO)$_4$ and InAlO$_3$(ZnO)$_4$ are listed in Table 1 below.

TABLE 1

|  | a | c |
|---|---|---|
| InGaO$_3$(ZnO)$_4$ | 3.308 Å | 32.962 Å |
| InAlO$_3$(ZnO)$_4$ | 3.266 Å | 33.010 Å |

Figure 3:
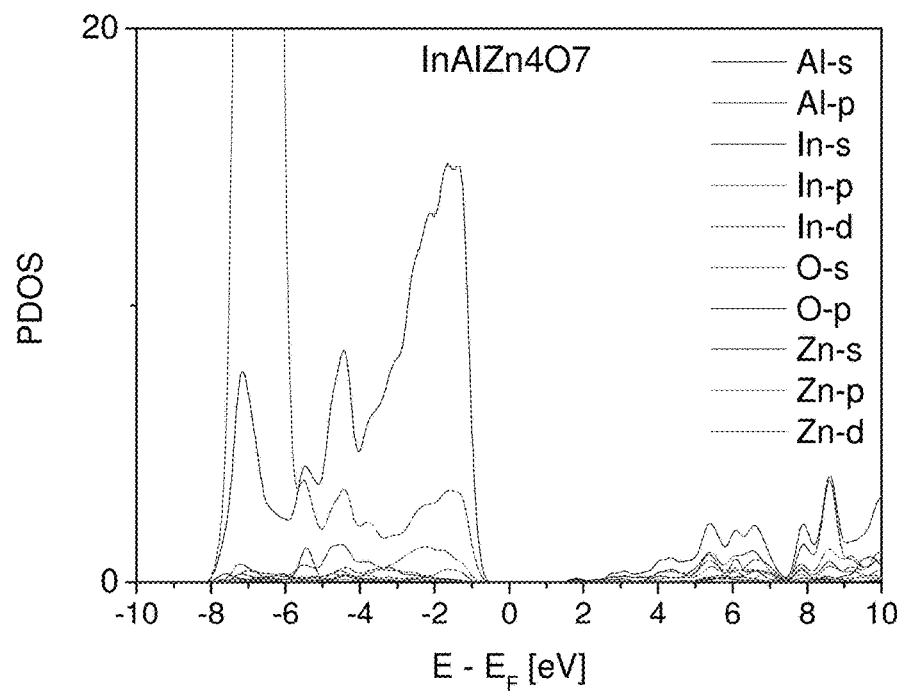
FIG. 3 illustrates a DOS (Density of State) of $InAlO_3(ZnO)_4$ according to an exemplary embodiment of the present application.
Figure 4:
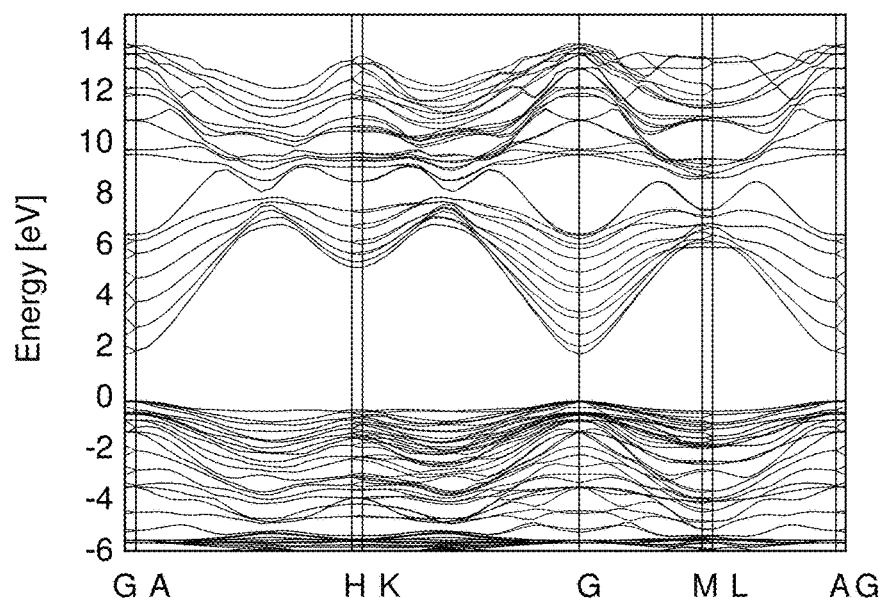
FIG. 4 illustrates a band structure of $InAlO_3(ZnO)_4$ according to an exemplary embodiment of the present application.
Figure 5:
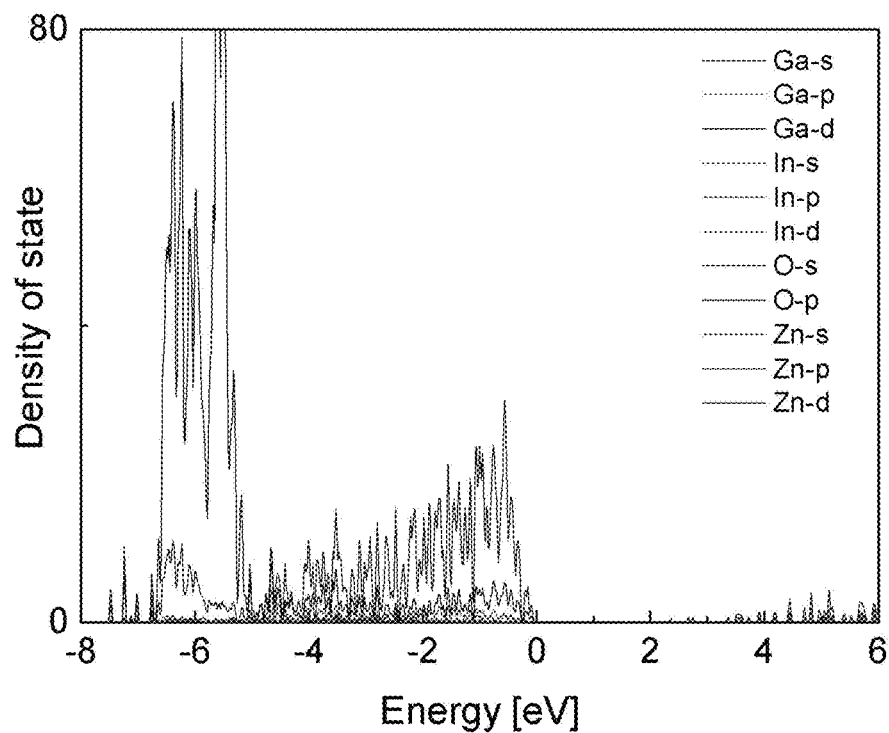
FIG. 5 illustrates a DOS (Density of State) of $InGaO_3(ZnO)_4$ according to an exemplary embodiment of the present application.
Figure 6:
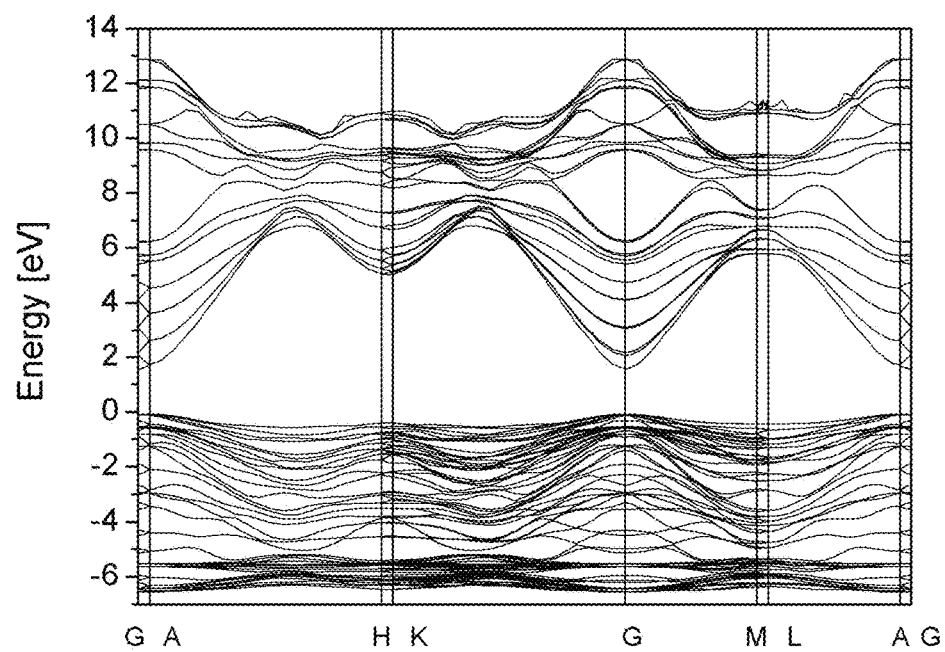
FIG. 6 illustrates a band structure of $InGaO_3(ZnO)_4$ according to an exemplary embodiment of the present application.

Further, as an exemplary embodiment of the present application, the DOS (Density of State) of InAlO$_3$(ZnO)$_4$ and InGaO$_3$(ZnO)$_4$ are illustrated in FIGS. 3 and 5, respectively, and the band structures of the nAlO$_3$(ZnO)$_4$ and InGaO$_3$(ZnO)$_4$ are illustrated in FIGS. 4 and 6, respectively.

In FIGS. 3 and 5, "0" on the horizontal axis of the DOS graph refers to Fermi energy of each material, and a valence band refers to bands of energy lower than the Fermi energy, and a conduction band refers to bands of energy higher than the Fermi energy. A valence band maximum (VBM) is formed of a p-orbital of oxygen of each material and a conduction band minimum (CBM) is formed of s-orbitals of respective aluminum and gallium.

In FIGS. 4 and 6, the band structure exhibits energy levels of electrons at lattice points in a reciprocal space, and "0" on the vertical axis refers to Fermi energy. A valence band refers to bands lower than the Fermi energy and a conduction band refers to bands higher than the Fermi energy. Since a reciprocal number of a second derivative with respect to the reciprocal space having the horizontal axis of bands refers to an effective mass of an electron, an example material of the present application has a high curvature of the conduction band with reference to a G point (gamma point). Thus, it can be seen that if a free electron is generated by n-type doping due to a low effective mass of the electron, a mobility of the free electron is high.

Figure 9:
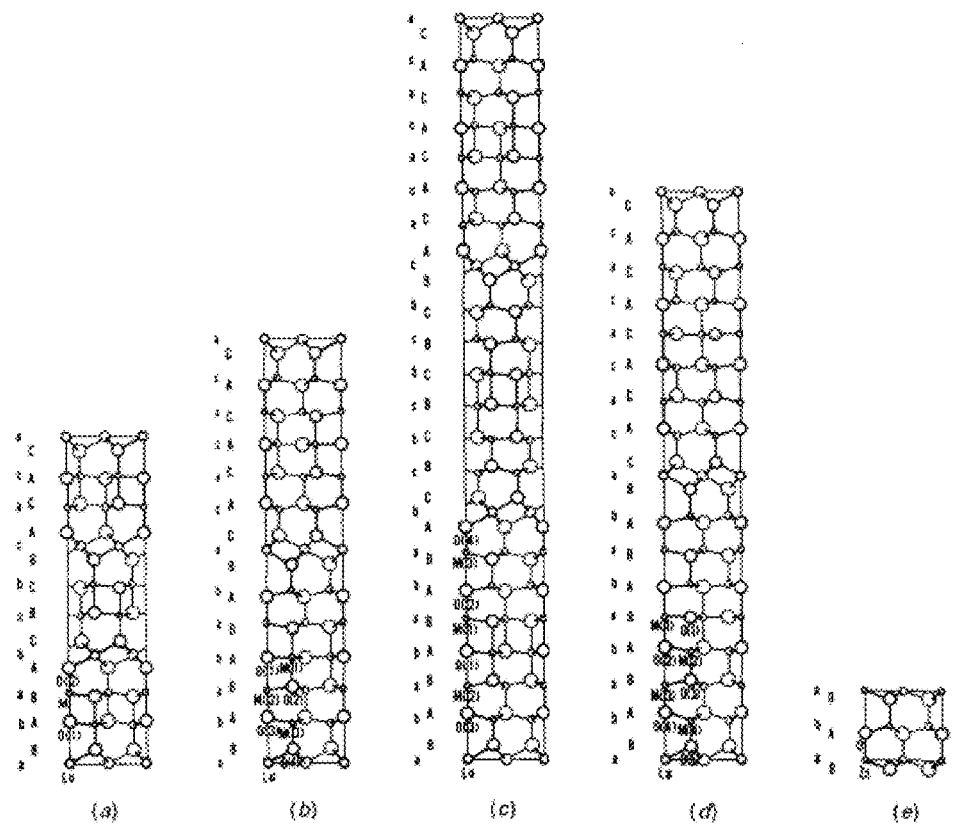
FIG. 9 illustrates a structure of LuFeO$_3$(ZnO)$_n$ (n: 1, 4, 5, or 6) according to an exemplary embodiment of the present application.

Further, as an exemplary embodiment of the present application, a structure of LuFeO$_3$(ZnO)$_n$ (n: 1, 4, 5, or 6) is illustrated in FIG. 9.

In FIG. 9, (a) illustrates a case where the n is 1, (b) illustrates case where the n is 4, (c) illustrates a case where the n is 5, (d) illustrates a case where the n is 6, and (e) illustrates a structure of ZnO.

In the structures of FIG. 9, lutetium (Lu) atoms present in an octahedral cavity and iron (Fe) atoms and zinc (Zn) atoms present in a tetrahedral cavity are closely packed with oxygen (O) atoms. In 1980s, N. Kimizuka et al. tried to synthesize a LuFeO$_3$—ZnO system. In order to manufacture a crystalline structure, they tried to grow Lu$_2$O$_3$, Fe$_2$O$_3$, and ZnO powder by using a solid-state reaction method. However, there is no record indicating that a crystalline material of precise stoichiometry was obtained.

Main factors of a crystal system of LuFeO$_3$(ZnO) are as follows:
Crystal system: Trigonal R3m
Lattice constant: a=3.4185 Å, c=25.463 Å
Main factors of a crystal system of LuFeO$_3$(ZnO)$_4$ are as follows:
Crystal system: Hexagonal P63/mmc
Lattice constant: a=3.3406 Å, c=32.51 Å
Main factors of a crystal system of LuFeO$_3$(ZnO)$_5$ are as follows:
Crystal system: Trigonal R3m
Lattice constant: a=3.3291 Å, c=56.56 Å
Main factors of a crystal system of LuFeO$_3$(ZnO)$_6$ are as follows:
Crystal system: Hexagonal P63/mmc
Lattice constant: a=3.3220 Å, c=42.91 Å

Further, in the transparent conductive film according to the present application, the compound of Chemical Formula 1 may be doped with an additional element.

To be more specific, the compound represented by Chemical Formula 1 may be additionally doped with an n-type dopant. The n-type dopant may comprise at least one selected from the group consisting of Sn, Ge, and Mo but may not be limited thereto.

For example, the InAlO$_3$(ZnO)$_4$ itself can be applied as an n-type semiconductor (band gap energy Eg=2.93 eV). In the case of InAlSnO$_3$(ZnO)$_4$ obtained by additionally doping the InAlO$_3$(ZnO)$_4$ with Sn, a mobility may be increased as compared with the InAlO$_3$(ZnO)$_4$ (~10 cm2/Vsec).

Further, the compound represented by Chemical Formula 1 may be additionally doped with a p-type dopant. The p-type dopant may be a nitrogen atom but may not be limited thereto.

For example, as a compound obtained by additionally doping the compound represented by Chemical Formula 1 with a p-type dopant, there is an N-doped InAlO$_3$(ZnO)$_4$. In the present specification, the N-doped InAlO$_3$(ZnO)$_4$ may be represented by InAlO$_3$(ZnO)$_4$:N. The N-doped InAlO$_3$(ZnO)$_4$ has lattice constants of a=3.221 Å and c=32.789 Å decreased by 1.4% on the a-axis and by 0.7% on the c-axis as compared with InAlO$_3$(ZnO)$_4$, and, thus, the N-doped InAlO$_3$(ZnO)$_4$ has a small strain in the structure caused by doping.

Figure 10:
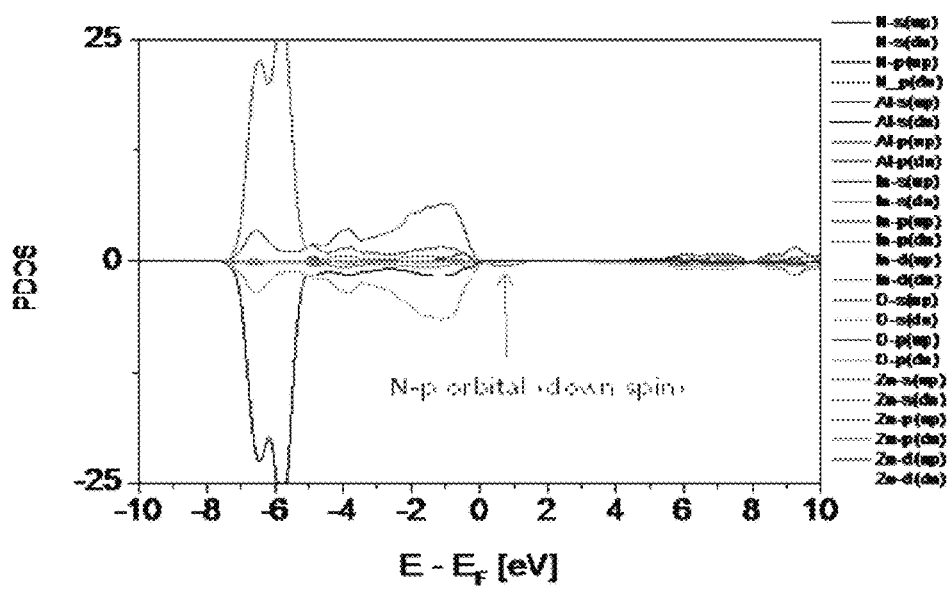
FIG. 10 illustrates a density of state of N-doped InAlO$_3$(ZnO)$_4$ according to an exemplary embodiment of the present application.
Figure 11:
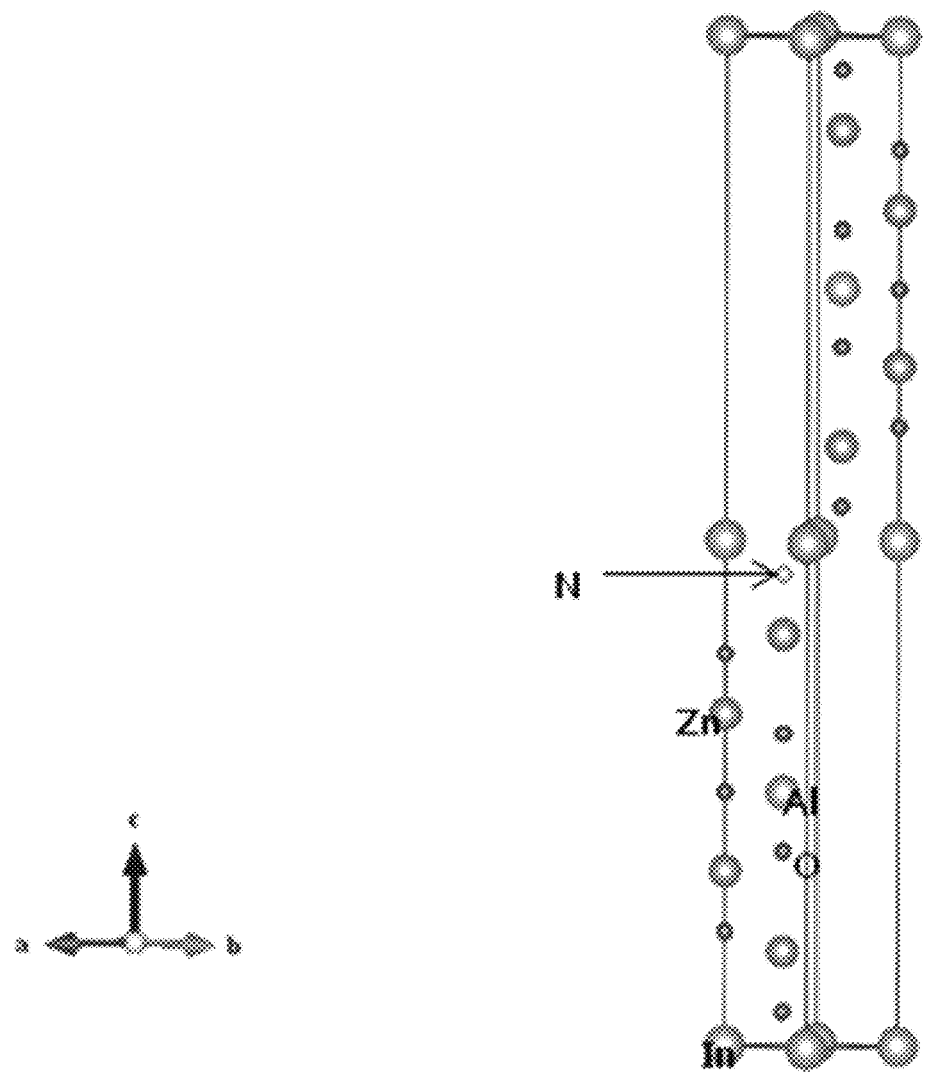
FIG. 11 illustrates a structure of N-doped InAlO$_3$(ZnO)$_4$ according to an exemplary embodiment of the present application.

A density of state of the N-doped InAlO$_3$(ZnO)$_4$ is illustrated in FIG. 10, and a structure of the N-doped InAlO$_3$(ZnO)$_4$ is illustrated in FIG. 11.

Referring to FIG. 10, it can be seen that a p-orbital component of N doping an O-site exhibits a p-type characteristic illustrated right above a VBM.

In the transparent conductive film according to the present application, a content range of an element in the compound of Chemical Formula 1, a content range of an additional doping element, etc. can be regulated in various ways to be suitable for purpose.

Further, according to another aspect of the present application, there is provided an electronic element comprising the transparent conductive film.

The transparent conductive film according to the present application can be used as a common electrode or pixel electrode of a liquid crystal display, an electrochromic display (ECD, an organic electroluminescence device, a solar cell, a plasma display panel, a flexible display, electronic paper, a touch panel, and the like.

Further, according to still another aspect of the present application, there is provided a thin film transistor comprising the transparent conductive film.

Furthermore, the transparent conductive film according to the present application can be used as a source electrode, a drain electrode, and a gate electrode of a thin film transistor and also used as an active layer and a gate insulating layer. That is, any one of the components of the thin film transistor can be formed of the transparent conductive film according to the present application or all of the components of the thin film transistor can be formed of the transparent conductive film according to the present application. Accordingly, a circuit of a smart window can be formed.

Figure 12:
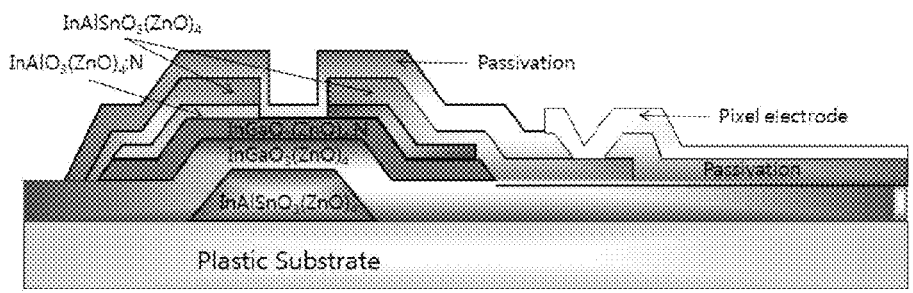
FIG. 12 illustrates a structure of a thin film transistor according to an exemplary embodiment of the present application.

A structure of a thin film transistor according to the present application is illustrated in FIG. 12.

FIG. 12 schematically illustrates a thin film transistor employing InAlO$_3$(ZnO)$_4$ and InGaO$_3$(ZnO)$_4$ as the compound represented by Chemical Formula 1.

To be more specific, the thin film transistor may comprise a gate electrode, a gate insulating layer, an active layer, a source electrode, and a drain electrode on a substrate. The gate electrode, the gate insulating layer, the active layer, the source electrode, and the drain electrode may comprise the compound represented by Chemical Formula 1 or a compound obtained by additionally doping the the compound represented by Chemical Formula 1 with the n-type dopant or the p-type dopant.

The gate electrode may comprise InAlSnO$_3$(ZnO)$_4$, and the gate insulating layer may comprise InGaO$_3$(ZnO)$_4$. Further, the active layer may comprise a first active layer and a second active layer, and the first active layer may comprise InGaO$_3$(ZnO)$_4$:N and the second active layer may comprise InAlO$_3$(ZnO)$_4$:N. Furthermore, the source electrode and the drain electrode may comprise InAlSnO$_3$(ZnO)$_4$.

That is, tin (Sn) is used as the n-type dopant and nitrogen (N) is used as the p-type dopant. Such an npn-type transistor may have a lattice value mismatching of less than about 1.3%. A thickness of the gate insulating layer may be 150 nm or less, and a thickness of each active layer may be 10 to 50 nm.

As physical properties, the thin film transistor may have a threshold voltage of ~1.3 V, an on-off ratio of greater than 105, a field effect mobility of ~10 cm$^2$/Vsec.

The compound represented by Chemical Formula 1 of the present application is applied to manufacturing films using a crystal growth method such as a molecular beam epitaxy method, and, thus, chemical, electrical, and optical properties thereof may be stable and superior to a conventionally known element using an amorphous material.

Further, a method for preparing the transparent conductive film according to the present application comprises forming, on a substrate, a compound having a crystalline structure and represented by Chemical Formula 1.

To be more specific, the transparent conductive film according to the present application may be prepared by using a DC/RF magnetron sputtering method or a molecular beam epitaxy method.

The DC/RF magnetron sputtering method can be used in a chamber (usually maintained at 10$^{-3}$ to 10$^{-8}$ torr) equipped with In$_2$O$_3$, Al$_2$O$_3$, ZnO, Ga$_2$O$_3$ sputter targets or a target having a chemical composition of InAlO$_3$(ZnO)$_4$ or InGaO$_3$(ZnO)$_4$ at a qualitative ratio by introducing a processing gas (O$_2$, N$_2$, etc.) of 10$^{-2}$ to 10$^{-3}$ torr into the chamber. In particular, the magnetron sputtering method can be applied to a roll-to-roll process. In this case, a thickness of the transparent conductive film can be adjusted to 10 nm to 10 μm.

In the case of using the molecular beam epitaxy method, with grains of metal, such as In, Al, and Ga, having a high purity (99.999% or more), metal atoms ionized at a high temperature by using an effusion cell can be epitaxied on a substrate at 10$^{-5}$ to 10$^{-6}$ for together with oxygen plasma beam in a chamber (usually maintained at 10$^{-8}$ torr or less). As a result, a film (thickness of 0.2 to 2,000 nm) at a single crystal level can be obtained.

In the present application, the substrate can be employed from those known in the art without limitation. To be more specific, the substrate may be a glass substrate, a plastic substrate, etc. but may not be limited thereto.

In the compound having a structure of (RXO$_3$)$_m$(AO)$_n$ as a new TCO material, its characteristic may begin with modulating a ratio between (RXO$_3$)$_m$ and (AO)$_n$. That is, as a specific example, it is confirmed that the InAlO$_3$(ZnO)$_4$ and the InGaO$_3$(ZnO)$_4$ is modulated at a ratio of 1:4. Typically, when m of the (RXO$_3$)$_m$ is fixed to 1 and n of the (AO)$_n$ varies, the most stable DOS (Density of State) can be obtained. Since the (RXO$_3$)$_m$ and the (AO)$_n$ are bonded to each other, both transparent conductivity and photoelectric applicability can be obtained simultaneously.

Desirably, a content of the X (Al, Ga, or the like) from the (RXO$_3$)$_m$(AO)$_n$ may be 50% or less of a content of the R (In or the like). This is because In from the InAlO$_3$(ZnO)$_4$ and the InGaO$_3$(ZnO)$_4$ has a property of maintaining an octahedron layer of InO$_2$, whereas Al or Ga as a material having a high reactivity has a property of breaking an octahedron structure. Nevertheless, such instability can be complemented by modulating a ZnO layer, which is a great advantage of the compound. When the N is 1, 3, 5, or 7 and the n is 2, 4, or 6, a rhomohedral lattice structure and a hexagonal lattice structure can be maintained well.

A material having a structure of (RXO$_3$)$_m$(AO)$_n$ comprising a specific example of the InAlO$_3$(ZnO)$_4$ and the InGaO$_3$(ZnO)$_4$ can be converted into an n-type TCO by using a dopant such as Sn, Ge, Mo, F, Ti, Zr, Hf, Nb, Ta, W, Te, B, Y, Sc, V, Si, etc. Such dopants can be substituted for the X of the (RXO$_3$)$_m$(AO)$_n$ compound. By adjusting the dopant and a ratio of m:n, an electronic band gap and an optical band gap can be variously adjusted from at least 2.9 eV to 3.4 eV in a crystalline state and from at least 2.6 eV to 3.4 eV in an amorphous state.

In particular, a material of a specific example of the InAlO$_3$(ZnO)$_4$ and the InGaO$_3$(ZnO)$_4$ can be used for a gate insulator (thickness of ~150 nm) of a circuit element as a key component of AMOLED, Flat Panel Display, and various optoelectronics, and can be used for an active layer (thickness of 10 to 50 nm) through n-type doping.

Mode

Hereinafter, a desirable example will be provided to facilitate an understanding of the present application. However, the following example is provided for the purpose of illustration of the present application but not limits the scope of the present application.

EXAMPLE

Example 1

A conductive film containing InAlO$_3$(ZnO)$_4$ or InGaO$_3$(ZnO)$_4$ was prepared to a thickness of 50 nm. A roll-to-roll process was applied using a DC/RF magnetron sputtering evaporator. A vacuum level of a chamber system was usually maintained at 10$^{-5}$ torr. In$_2$O$_3$, Al$_2$O$_3$, ZnO, Ga$_2$O$_3$ sputter targets (1,600×125 mm$^2$, ~3.5 KW power applied) were installed at the evaporator and spaced 70 to 75 mm apart from a plastic substrate (eg. PET, PC having a width of 1,050 mm). By additionally introducing an O$_2$ gas, an oxygen atoms insufficient for vapor deposition were supplied. As a result, a transparent conductive film containing InAlO$_3$(ZnO)$_4$ and InGaO$_3$(ZnO)$_4$ at a qualitative ratio was obtained.

Figure 7:
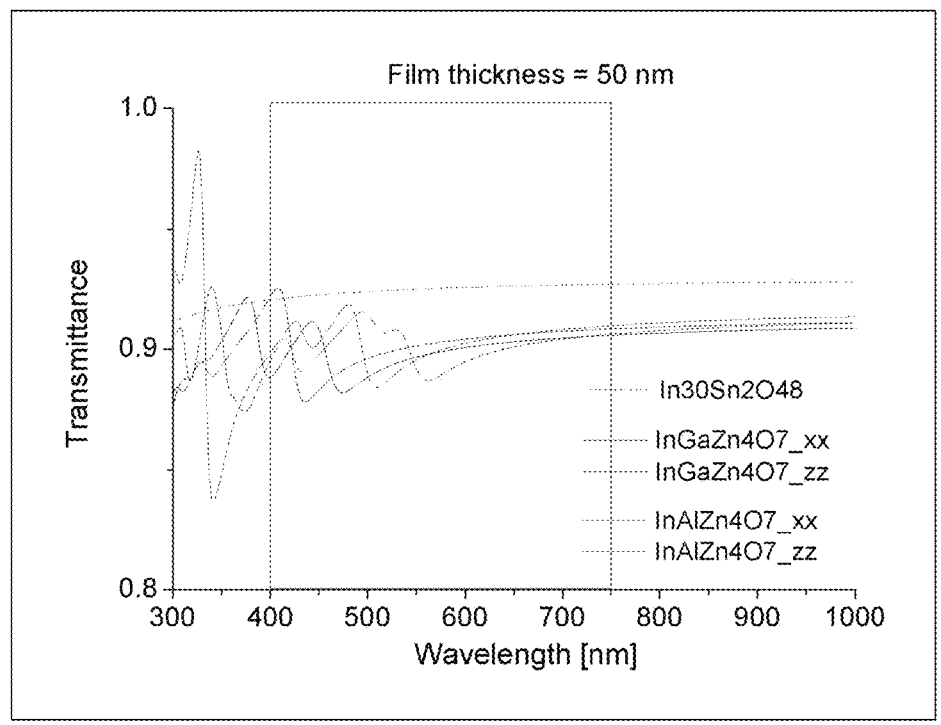
FIG. 7 illustrates optical transmittance of a conductive film according to an exemplary embodiment of the present application.
Figure 8:
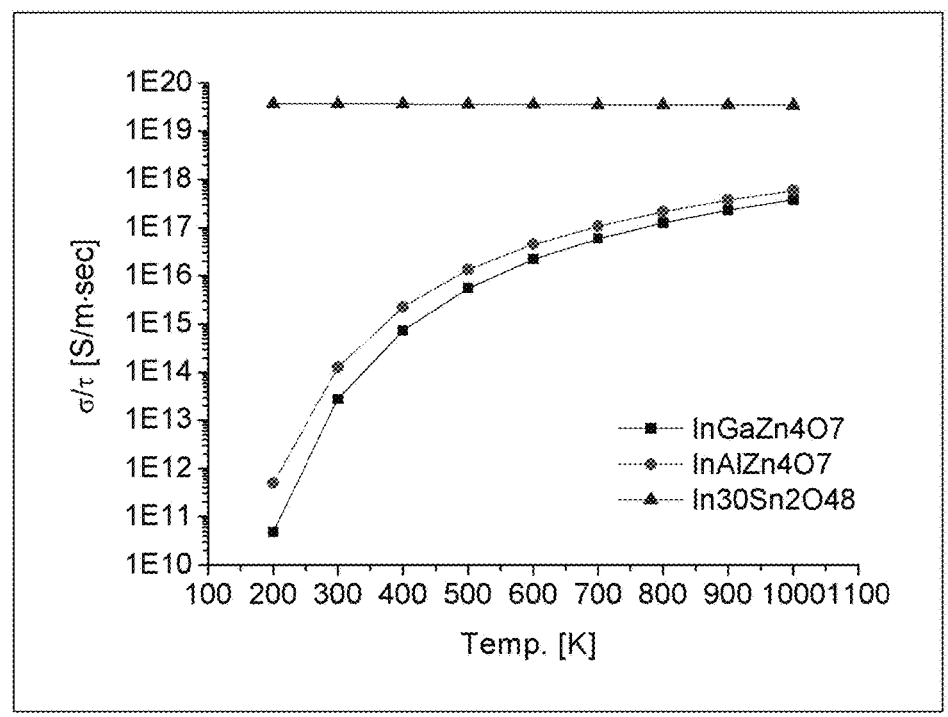
FIG. 8 illustrates electrical transmittance of a conductive film according to an exemplary embodiment of the present application.

Optical transmittance of the conductive film was obtained by a hybrid method (HSE06 method) and a result thereof is illustrated in FIG. 7. Electrical conductivity is illustrated in FIG. 8.

As confirmed in the above results, transmittance of visible light was as high as 87 to 91%. Further, at room temperature (300K), electrical conductivity of the conductive film containing InAlO$_3$(ZnO)$_4$ was about 10$^{-3}$ S/cm and electrical conductivity of the conductive film containing InGaO$_3$(ZnO)$_4$ was about 10$^{-4}$ S/cm.

The invention claimed is:
1. A transparent conductive film comprising:
a compound having a crystalline structure and of Chemical Formula 1:

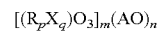  [Chemical Formula 1]

wherein:
R is Sc, Fe, Cu, Ga, Y, In, Er, Tm, Yb, or Lu,
X is Al,
A is Mg, Mn, Co, or Zn,
m is 1 to 4,
n is 1 to 7, and p and q represent an atom content ratio of greater than 0 to 1 or less independently of each other.

2. The transparent conductive film of claim 1, wherein the R of Chemical Formula 1 is In or Lu.

3. The transparent conductive film of claim 1, wherein the compound represented by Chemical Formula 1 is $InAlO_3(ZnO)_n$, and the n is 1 to 7.

4. The transparent conductive film of claim 1, wherein the compound represented by Chemical Formula 1 is additionally doped with an n-type dopant.

5. The transparent conductive film of claim 4, wherein the n-type dopant comprises at least one selected from the group consisting of Sn, Ge, and Mo.

6. The transparent conductive film of claim 1, wherein the compound represented by Chemical Formula 1 is additionally doped with a p-type dopant.

7. The transparent conductive film of claim 6, wherein the p-type dopant is a nitrogen atom.

8. An electronic element comprising the transparent conductive film of claim 1.

9. A thin film transistor comprising the transparent conductive film of claim 1.

10. The thin film transistor of claim 9, wherein the thin film transistor comprises a gate electrode, a gate insulating layer, an active layer, a source electrode, and a drain electrode on a substrate, and the gate electrode, the gate insulating layer, the active layer, the source electrode, and the drain electrode comprises the compound represented by Chemical Formula 1 or a compound obtained by additionally doping the compound represented by Chemical Formula 1 with the n-type dopant or the p-type dopant.

11. The thin film transistor of claim 10, wherein the gate electrode comprises $InAlSnO_3(ZnO)_4$.

12. The thin film transistor of claim 10, wherein the source electrode and the drain electrode comprise $InAlSnO_3(ZnO)_4$.

13. A method for preparing a transparent conductive film comprising forming, on a substrate, a compound having a crystalline structure and of Chemical Formula 1:

$$[(R_pX)O_3]_m(AO)_n \qquad \text{[Chemical Formula 1]}$$

wherein:
R is Sc, Fe, Cu, Ga, Y, In, Er, Tm, Yb, or Lu,
X is Al,
A is Mg, Mn, Co, or Zn,
m is 1 to 4,
n is 1 to 7, and
p and q represent an atom content ratio of greater than 0 to 1 or less independently of each other.

14. The method for preparing a transparent conductive film of claim 13, wherein the forming a compound represented by Chemical Formula 1 uses a DC/RF magnetron sputtering method or a molecular beam epitaxy method.

15. The method for preparing a transparent conductive film of claim 13, wherein the compound represented by Chemical Formula 1 is $InAlO_3(ZnO)_n$, and the n is 1 to 7.

16. The method for preparing a transparent conductive film of claim 13, wherein the compound represented by Chemical Formula 1 is additionally doped with an n-type dopant.

17. The method for preparing a transparent conductive film of claim 13, wherein the compound represented by Chemical Formula 1 is additionally doped with a p-type dopant.

* * * * *